United States Patent
Gao

(10) Patent No.: US 12,041,750 B2
(45) Date of Patent: Jul. 16, 2024

(54) FLUID CONNECTION APPARATUS FOR SERVERS AND RACKS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 206 days.

(21) Appl. No.: 17/685,205

(22) Filed: Mar. 2, 2022

(65) Prior Publication Data
US 2023/0284415 A1      Sep. 7, 2023

(51) Int. Cl.
H05K 7/20       (2006.01)

(52) U.S. Cl.
CPC ..... H05K 7/20272 (2013.01); H05K 7/20781 (2013.01)

(58) Field of Classification Search
CPC ........... H05K 7/20272; H05K 7/20763; H05K 7/20772; H05K 7/20781
See application file for complete search history.

(56) References Cited

U.S. PATENT DOCUMENTS

| | | | | |
|---|---|---|---|---|
| 7,450,385 | B1* | 11/2008 | Campbell | H05K 7/20781 361/689 |
| 7,539,020 | B2* | 5/2009 | Chow | H05K 7/20781 361/759 |
| 8,289,710 | B2* | 10/2012 | Spearing | H05K 7/20727 361/699 |
| 9,351,428 | B2* | 5/2016 | Eckberg | F16L 37/34 |
| 9,354,676 | B2* | 5/2016 | Shelnutt | H05K 7/20781 |
| 10,004,164 | B2* | 6/2018 | Leigh | H05K 7/20172 |

* cited by examiner

Primary Examiner — Robert J Hoffberg
(74) Attorney, Agent, or Firm — WOMBLE BOND DICKINSON (US) LLP

(57) ABSTRACT

Embodiments are disclosed of an IT rack and a server including a cooling module. An integrated fluid distribution manifold set with a supply manifold is on the front of the rack and a return manifold is on the rear of the rack. The supply manifold extends from the front to the rear and rack connectors, which fluidly couple the rack to a data center facility system, are on the top of the rack. Supply and return connectors are positioned so that the connectors face each other within the rack. Each server includes a cooling module with a movable connector set that can extend outside the server chassis to connect with the manifolds. The cooling module's connector set includes a transmission structure that allows the supply and return connectors of the connector set to engage with connectors on the supply and return manifolds.

19 Claims, 8 Drawing Sheets

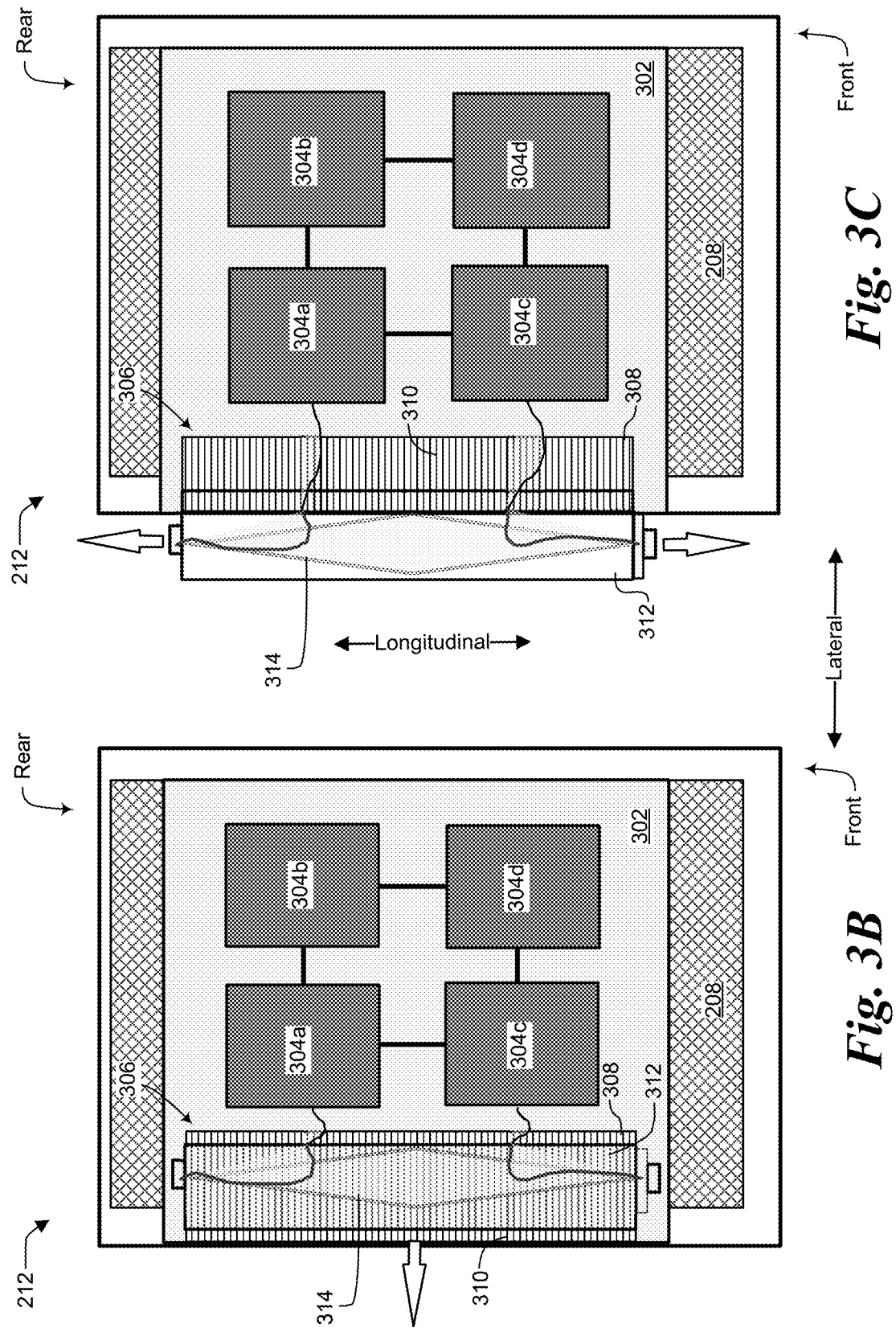

FLUID CONNECTION APPARATUS FOR SERVERS AND RACKS

TECHNICAL FIELD

The disclosed embodiments relate generally to information technology (IT) liquid cooling systems, but not exclusively, to an apparatus and system for fluid connection in IT racks.

BACKGROUND

Modern data centers house enormous amounts of information technology (IT) equipment such as servers, blade servers, routers, edge servers, power supply units (PSUs), battery backup units (BBUs), etc. These individual pieces of IT equipment are typically housed in racks within the computing center, with multiple pieces of IT equipment in each rack. The racks are typically grouped into clusters within the data center.

As IT equipment has become more computationally powerful it consumes more electricity and also generates more heat that must be removed from the IT equipment to keep it operating properly. Various cooling solutions have been developed to keep up with this increasing need for heat removal. One solution is liquid cooling, in which heat-generating components are cooled by a cooling fluid circulating through a cooling system that is thermally coupled to the IT equipment. One potential problem with liquid-cooling systems is that the cooling fluid should be kept separate from electrical components to avoid electrical shorting and other potential damages; put differently, leaks should be minimized or avoided. Previous liquid-cooling solutions are built using either manual mating connectors or blind mating connectors, but these can require complicated designs for blind mating and can result in a lack of reliability for manual mating, making it difficult to minimize or avoid leaks.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 2A is a side view, FIGS. 2B-2C top views.

FIGS. 3A-3C are top views of an embodiment of a cooling module. FIG. 3A is a top view of an embodiment of the cooling module's construction and FIGS. 3B-3C are top views illustrating an embodiment of the cooling module's operation.

DETAILED DESCRIPTION

Figure 1:
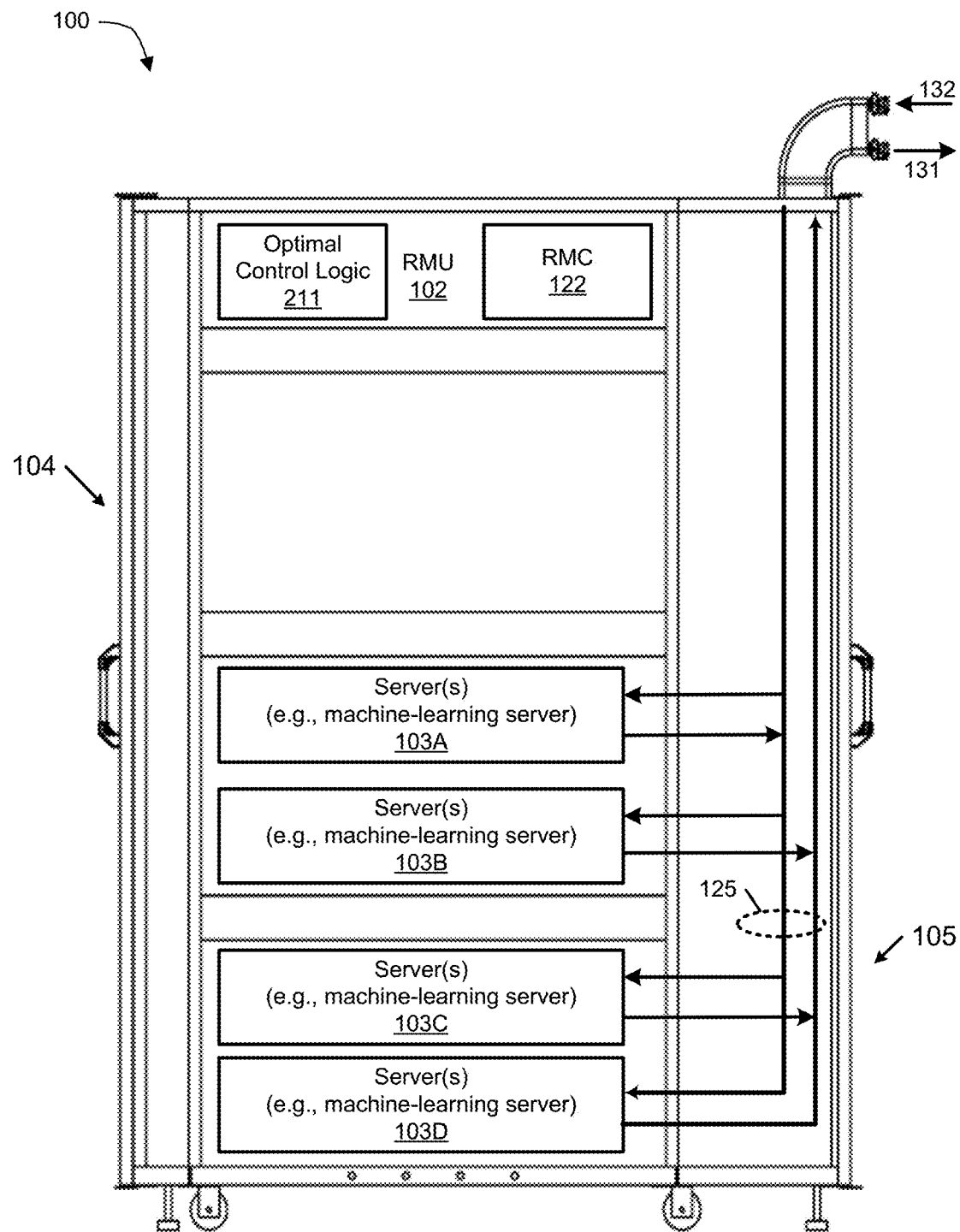
FIG. 1 is a side view of an embodiment of a liquid-cooled information technology (IT) rack populated with various pieces of IT equipment.

Embodiments are described of a fluid connection apparatus and system for use with information technology (IT) equipment in a data center or an IT container such as an IT rack. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments. As used in this application, directional terms such as "front," "rear," "top," "bottom," "side," "lateral," "longitudinal," etc., refer to the orientations of embodiments as they are presented in the drawings, but any directional term should not be interpreted to imply or require a particular orientation of the described embodiments when in actual use.

The disclosed embodiments are of rack designs and server designs for fluid connection in liquid cooling system. The disclosed embodiments enable some or all of the following benefits:

High packaging densities.
Highly reliable fluid connections.
Low cost of blind mating connections.
Different server and rack configurations.
Fluid system connection and interface compatibilities.
Expandable solution.
Separation of liquid and electronics.
Prevention of failure and incorrect operation.
Coexistence of different heterogeneous computing systems.

The described embodiments are of an IT rack and a server including a cooling module. The IT rack and server together enable more efficient fluid connections using different fluid connectors and interfaces and significantly increase the overall reliability of fluid connections. The described embodiments include a fluid distribution manifold set with a supply manifold on the front side of the rack and a return manifold on the rear side of the rack. The supply and return manifolds are integrated to the rack. The supply manifold extends from the front side to the rear side of the rack, and rack connectors, which fluidly couple the rack to the data center, are designed on the rear side of the rack. Supply and return connectors are designed on the manifolds so that the connectors face each other within the rack. Each server housed in the rack includes a cooling module attached onto the main server board. The cooling module includes a connector set which can be manually extended outside the server chassis. The cooling module's connector set includes a transmission structure that allows both the supply and return connectors of the connector set to engage with the supply and return connectors on the supply and return manifolds.

According to one aspect, a server cooling module includes a board having one or more liquid cooling devices mounted thereon, the board having a first dimension and a second dimension. The server cooling module further includes a slider assembly mounted on or near an edge of the board, the slider assembly including a slider movable both ways along the first dimension and a fluid connection mechanism positioned in the slider. The fluid connection mechanism includes a first fluid connector movable both ways along the second dimension, a second fluid connector spaced apart from the first fluid connector along the second dimension and movable both ways along the second dimension. The second fluid connector is coupled to the first fluid connector by a transmission mechanism, wherein when the first fluid connector moves one way along the second dimension the transmission mechanism causes the second fluid connector to move the opposite way along the second dimension. The server cooling module further includes a first flexible fluid line to fluidly couple the first fluid connector to the one or more liquid cooling devices and a second flexible fluid line to fluidly couple the second fluid connector to the one or more liquid cooling devices.

In one embodiment, at least one of the first fluid connector and the second fluid connector is a blind mating connector. The transmission mechanism is a scissor mechanism mechanically coupled to the first fluid connector and the second fluid connector. The first dimension may be substantially perpendicular to the second dimension. The first dimension may be a lateral dimension of the board and the second dimension is a longitudinal dimension of the board. The first fluid connector and the second fluid connector are collinear and face opposite directions. The slider assembly further includes a fixed part attached to the board, the fixed part including a plurality of guide channels that engage the slider and guide the motion of the slider relative to the fixed part.

According to another aspect, a server cooling system includes a circuit board having one or more heat-generating components mounted thereon and a server cooling module as described above.

According to a further aspect, an information technology (IT) rack includes an IT rack frame having a top, a bottom, a front, a rear, and a pair of lateral sides; a fluid supply manifold positioned in the IT rack, the fluid supply manifold having a rack inlet and a plurality of supply outlets, the plurality of supply outlets being positioned at or near the front of the IT rack, and each supply outlet including a fluid connector; and a fluid return manifold positioned in the IT rack, the fluid return manifold having a rack outlet and a plurality of return inlets, the plurality of return inlets being positioned at or near the rear of the IT rack, and each return inlet including a fluid connector. The rack inlet and the rack outlet are positioned at the top of the IT rack or on the rear of the IT rack.

FIG. 1 illustrates an embodiment of an information technology (IT) rack 100, which is a type of IT container commonly used in data centers. In one embodiment, electronic rack 100 includes rack management unit (RMU) 102, and one or more server blades 103A-103D, collectively referred to as server blades 103. Server blades 103 can be inserted into an array of server slots respectively from front end 104 of electronic rack 100. Note that although only four server blades 103A-103D are shown, more or fewer server blades can be maintained within electronic rack 100. Also note that the particular positions of RMU 102 and server blades 103 are shown for the purpose of illustration only; other arrangements or configurations of CMU 102 and server blades 103 can also be implemented. Further, the front door disposed on front end 104 and the back door disposed on back end 105 are optional. In some embodiments, there can be no door on front end 104 and/or back end 105.

Liquid manifold 125 receives cooling liquid from rack inlet 132 and returns cooling liquid to rack outlet 131. In one embodiment, the processors can be mounted on the cold plates, where the cold plates include a liquid distribution channel embedded therein to receive the cooling liquid from the liquid manifold 125 and to return the cooling liquid carrying the heat exchanged from the processors back to the liquid manifold 125. Rack 100 is an example of an IT rack in which embodiments of a fluid distribution system, such as the ones shown in FIGS. 2A-2C et seq., can be used.

Each server blade 103 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 103 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 100 further includes RMU 102 configured to provide and manage power supplied to server blades 103. RMU 102 can be coupled to a power supply unit (not shown) to manage the power consumption of the power supply unit. The power supply unit can include the necessary circuitry (e.g., an alternating current (AC) to direct current (DC) or DC to DC power converter, battery, transformer, or regulator, etc.) to provide power to the rest of the components of electronic rack 100.

In one embodiment, RMU 102 includes optimal control logic 211 and rack management controller (RMC) 122. The optimal control logic 211 is coupled to at least some of server blades 103 to receive operating status of each of the server blades 103, such as temperatures of the processors, temperature of the cooling liquid, etc. Based on this information, optimal control logic 211 can attempt to optimize a predetermined objective function, such that the output of the objective function reaches the maximum while a set of predetermined constraints is satisfied.

Figure 2A:
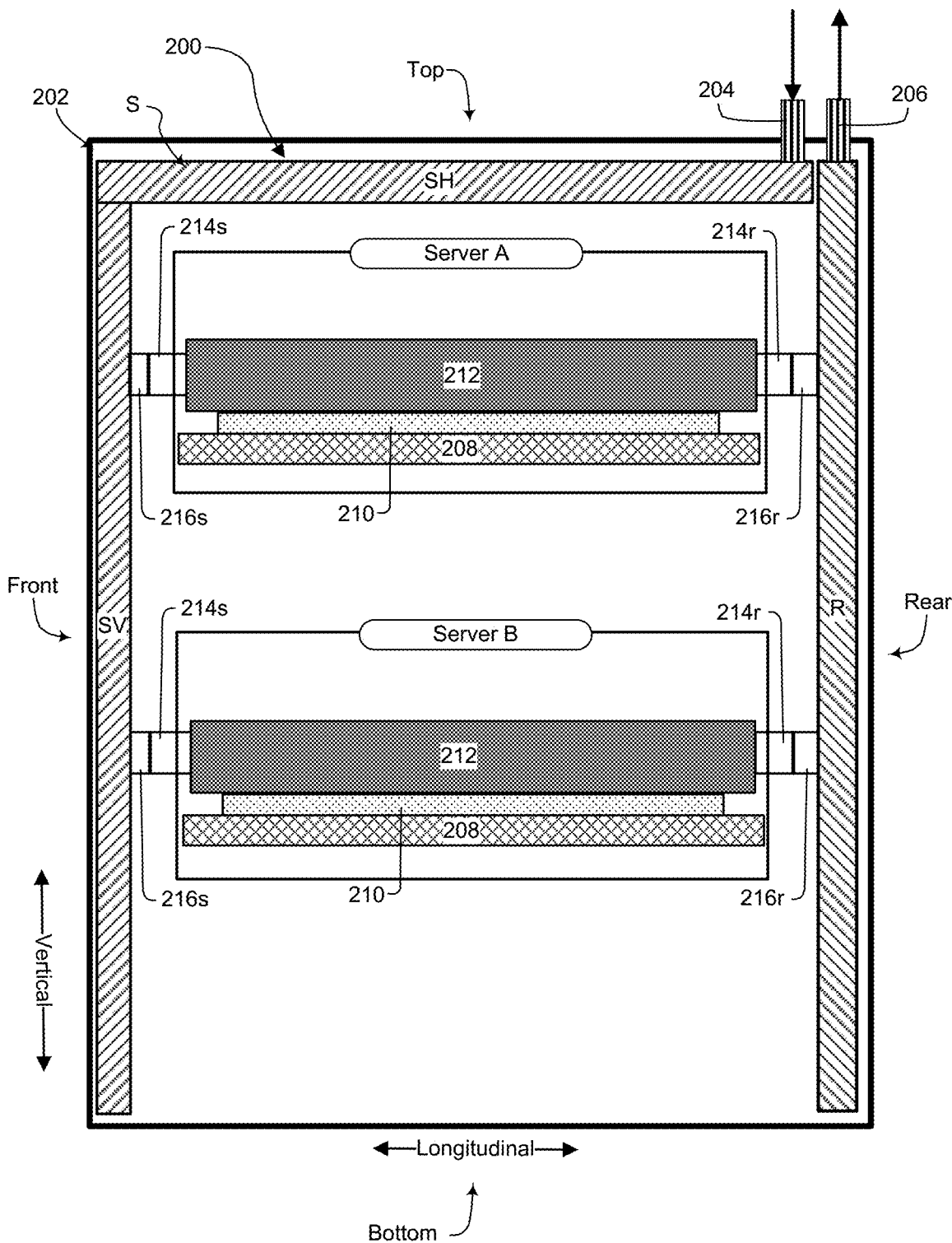
FIGS. 2A-2C are views of an embodiment of an information technology (IT) rack including fluid connection components.
Figures 2B, 2C:
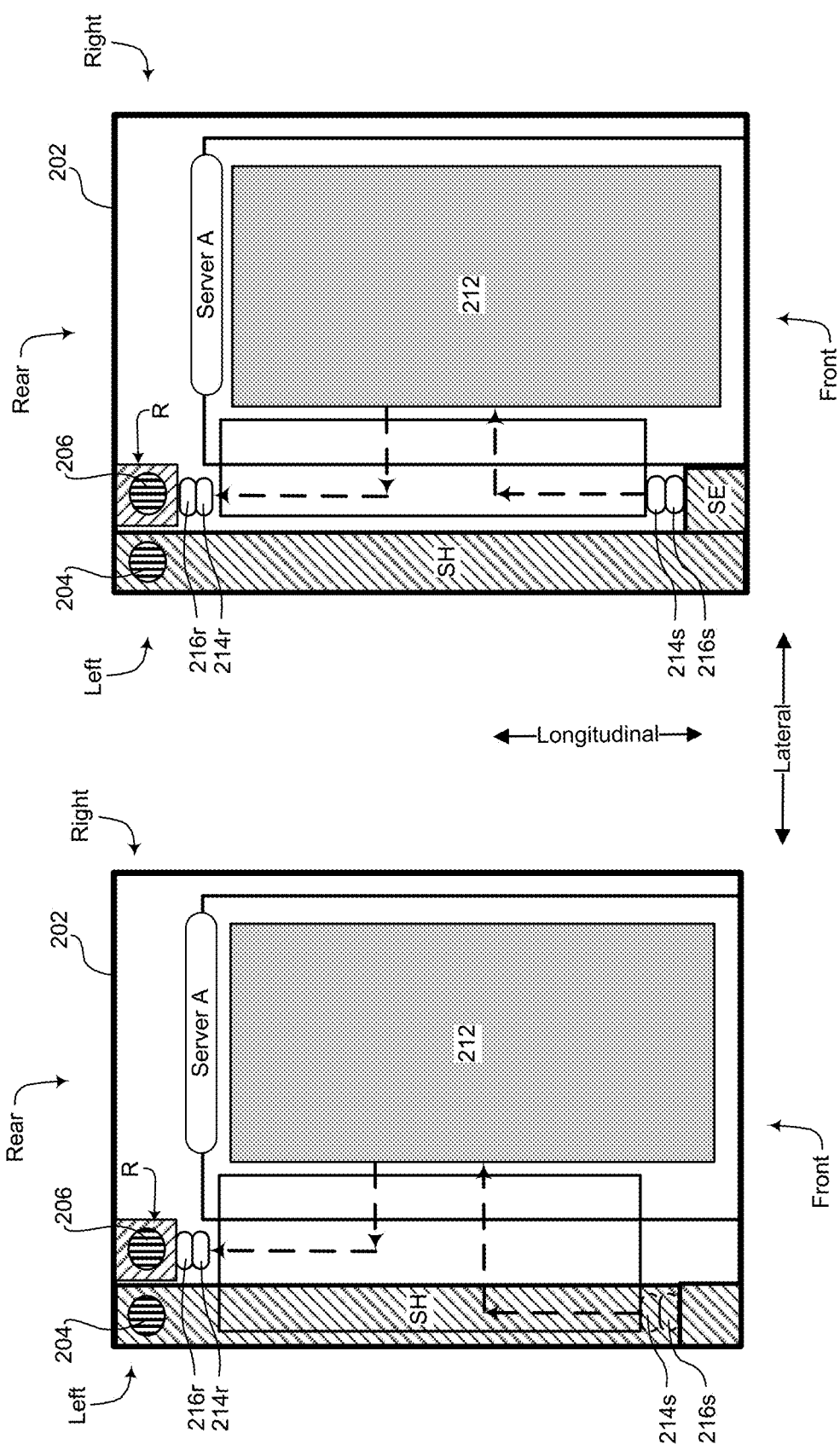

FIGS. 2A-2C together illustrate an embodiment of a fluid distribution system 200 housed in an IT rack 202; FIG. 2A is a side view, FIGS. 2B-2C are top views. IT rack 202 itself is not part of the fluid distribution system. Along with fluid distribution system 200, one or more pieces of IT equipment such as servers are housed in rack 202. In the illustrated embodiment two servers—server A and server B—are housed in rack 202, but in other embodiments there can be more or fewer pieces of IT equipment within the rack than shown, and the IT equipment need not all be servers (see, e.g., FIG. 1).

Fluid distribution system 200 includes a fluid supply manifold S and a fluid return manifold R that together distribute cooling fluid to the servers housed in the rack 202. Fluid supply manifold S has two parts: a horizontal part SH that runs horizontally at or near the top of rack 202, and a vertical part SV that runs vertically at or near the front of rack 202 and substantially from the bottom to the top of the rack. In another embodiment, horizontal part SH can be omitted entirely by positioning inlet 204 at the front of rack 202 instead of at the rear of the rack; in such an embodiment vertical part SV forms the entire supply manifold S. Fluid return manifold R is positioned at or near the rear of rack 202 and runs vertically substantially from the bottom of the rack to the top. In the illustrated embodiment, supply manifold S is positioned along the left side of the rack (see FIGS. 2B-2C) and return manifold R is also positioned near the left side of the rack, just to the right of supply manifold S. In other embodiments, supply manifold S and return manifold or can be positioned differently. For instance, in another embodiment supply manifold S can be positioned along the right side of the rack and return manifold R positioned just to the left of supply manifold S.

Vertical part SV of the supply manifold S has a plurality of supply outlets, each with a connector 216s. Similarly, return manifold R includes a plurality of return inlets, each having a connector 216r. Each connector 216s on the supply manifold is positioned facing a corresponding connector 216r on the return manifold; each connector 216s and its corresponding connector 216r will generally be positioned at the same height within rack 202. In the embodiment shown in FIG. 2B, supply connectors 216s are laterally offset from return connectors 216r; in the illustrated embodiment, supply connectors 216s are to the left of their corresponding return connectors 216r, but in an embodiment with supply manifold S on the right side of the rack each supply connectors 216s would be to the right of its corresponding return connector 216r; put differently, supply connector 216s and return connector 216r are positioned on different but parallel longitudinal axes. This lateral offset between corresponding connectors can be accounted for in the construction of the cooling module 212. In the embodiment shown in FIG. 2C, vertical part SV of supply manifold S includes a lateral supply extension SE that extends laterally (to the right in the illustrated embodiment) from vertical part SV, and supply connectors 216s are fluidly coupled to the lateral supply extension SE. Lateral supply extension SE allows supply connectors 216s to be positioned directly across from their corresponding return connector 216r, so that they directly face each other—that is, the connectors are no longer laterally offset from each other and are instead positioned along the same longitudinal axis. In one embodiment, one or both of connectors 216s and 216r are dripless bind-mating connectors, but in other embodiments they can be different types of fluid connectors.

A rack inlet 204 is positioned at the top rear of rack 202 and is fluidly coupled to horizontal part SH. Horizontal part SH is in turn fluidly coupled to vertical part SV, so that fluid entering through inlet 204 flows into and through horizontal part SH, then into and through vertical part SV, and out of vertical part SV through fittings 216s. A rack outlet 206 at the top rear of rack 202 is fluidly coupled to return manifold R, so the fluid entering the return manifold R through connectors 216r flows out of the manifold through outlet 206. In one embodiment, rack inlet 204 and rack outlet 206 are fluidly coupled to the facility fluid distribution system of a data center. In other embodiments rack inlet 204 and rack outlet 206 can be positioned differently than shown, for instance on the rear side, left side, or right side of rack 202 instead of the top of the rack.

Each of servers A and B includes a circuit board 208 on which are mounted one or more heat-generating electronic components 210. A cooling module 212 is thermally coupled to at least one of the one or more heat-generating electronic components 210 to provide liquid cooling of the heat-generating components. Each cooling module 212 is fluidly coupled to vertical part SV of the supply manifold and to return manifold R. In the illustrated embodiment, each cooling module 212 includes a supply connector 214s and a return connector 214r. In the illustrated embodiment, connectors 214s and 214r are positioned so that the face in opposite directions.

Each supply connector 214s is adapted to be coupled to corresponding connector 216s on the vertical part SV, and each return connector 214r is adapted to be coupled to connector 216 are on the return manifold R. In one embodiment connector 216r is a blind-mating connector and connector 216s is a manual connector, so that connectors 214r and 216r can be connected blindly and connectors 214s and 216s can be connected manually. Other embodiments can, of course, use different combinations and types of connectors to fluidly couple cooling modules 212 to the supply and return manifolds, and in still other embodiments not every server in the rack need use the same types of connectors to be fluidly coupled to the supply and return manifolds. An embodiment of a cooling module 212 is described below in connection with FIG. 3.

In operation of fluid distribution system 200, cooling fluid is circulated through the fluid paths created by the manifold and cooling modules to remove heat generated by the operation of heat-generating components 210. The flow paths of the cooling fluid through the rack are illustrated in FIGS. 2A-2C. Chilled cooling fluid from a data center fluid supply enters supply manifold S through rack inlet 204, flows into and through horizontal part SH, into and through vertical part SV, and out of the distribution ports of vertical part SH through fittings 216s. After leaving supply manifold S, the cooling fluid enters cooling modules 212 through fittings 214s. Once inside the cooling module the cooling fluid absorbs heat from the heat-generating components 210. Heated cooling fluid then exits cooling modules 212 through fittings 214r, after which it enters the return inlets of return manifold or through fittings 216r. The heated cooling fluid then flows out of manifold R through rack outlet 206.

Figure 3A:
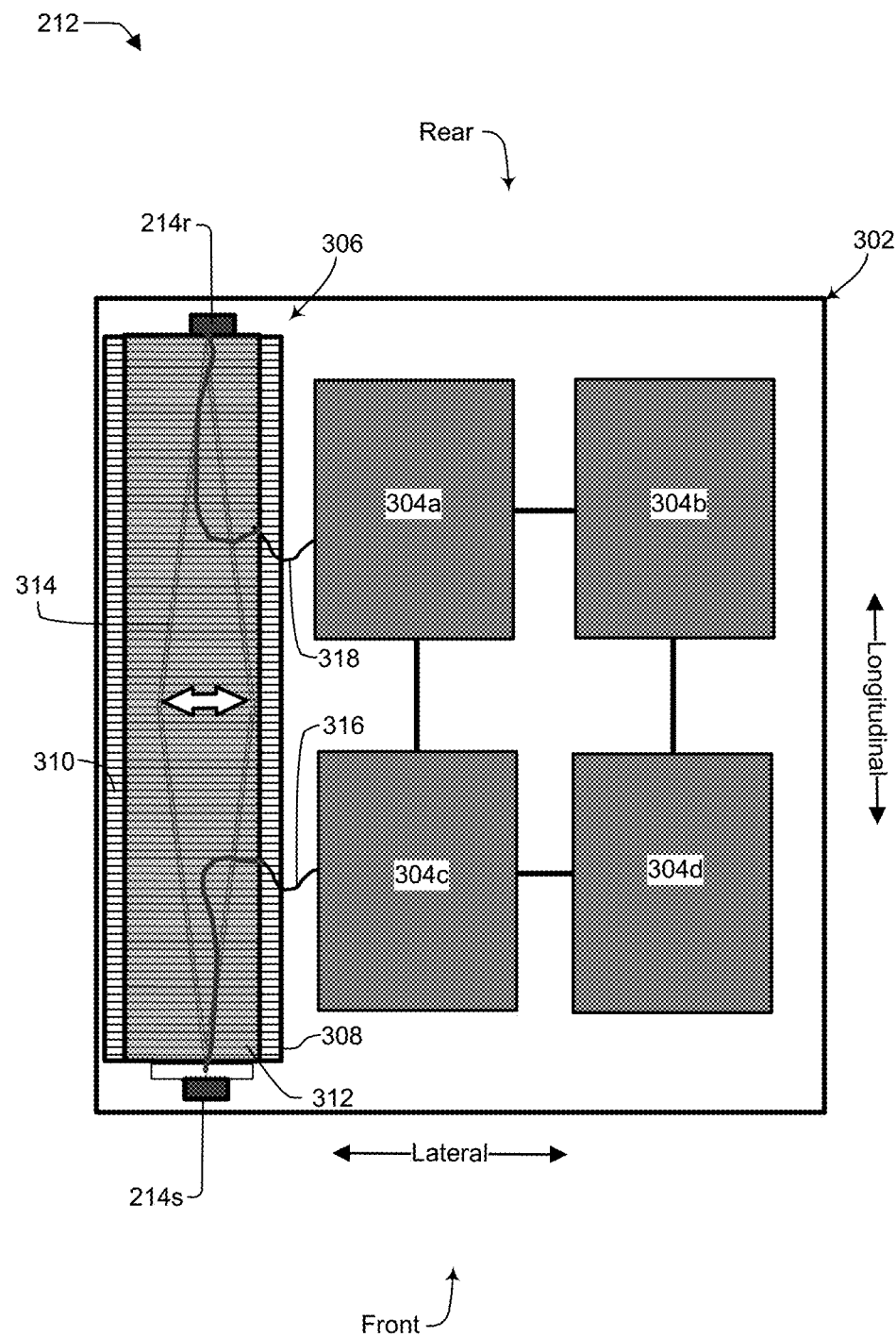

FIGS. 3A-3C together illustrate an embodiment of a cooling module 212 that can be used in cooling system 200 in a rack 202. FIG. 3A illustrates the construction of cooling module 212, FIG. 3B illustrates the cooling module 212 with slider 312 and transmission structure 314 in their retracted positions, and FIG. 3C illustrates the cooling module with slider 312 and transmission structure 314 in their extended positions.

Cooling module 212 includes a board 302 that has first and second dimensions; in the illustrated embodiment the first dimension is a lateral dimension (i.e., a dimension measured along the lateral direction) and the second dimension is a longitudinal dimension (i.e., a dimension measured along the longitudinal direction). One or more liquid cooling devices 304 are mounted on board 302. The illustrated embodiment has four liquid-cooling devices 304a-304d, but other embodiments can have more or less liquid-cooling devices than shown. In one embodiment, liquid-cooling devices 304 are cold plates, but in other embodiments other kinds of liquid-cooling devices can be used. The positions of liquid-cooling devices 304a-304d on board 302 are generally chosen to correspond to the positions of heat-generating components on a server to which cooling module 212 will be coupled, so that each liquid-cooling device 304 can be thermally coupled to a heat-generating component.

A slider assembly 306 is positioned along a lateral edge of board 302. When cooling module 212 is coupled to a server such as server A, slider assembly 306 enables the server to be inserted into a rack with the manifold configuration of FIGS. 2A-2C and to be easily fluidly coupled to the supply and return manifolds. Slider assembly 306 includes a fixed part 308 that is mounted to board 302 and therefore stationary relative to the board. Fixed part 308 includes a plurality of sliding channels 310, and a slider 312 is coupled to fixed part 308 by the plurality of sliding channels 310. Sliding channels 310, in addition to coupling slider 312 to fixed part 308, guide the motion of slider 312 relative to fixed part 308, so that slider 312 can move between a retracted position shown in FIG. 3B and an extended position, shown in FIG. 3C. Slider 312 can move in both directions: from the retracted position to the extended position, and from the extended position to the retracted position. Other hardware, (not shown) such as clips or setscrews, can be used if needed to keep the slider in a fixed position relative to fixed part 308.

Supply connector 214s and return connector 214r are positioned at opposite longitudinal ends of slider 312, so that both connectors move with the slider when the slider is moved laterally back and forth. Also positioned within slider 312 is a transmission mechanism 314 that is mechanically coupled to both supply connector 214s and return connector 214r. Transmission mechanism 314 is designed to move the connectors and opposite directions. Thus, if supply connector 214s is moved longitudinally toward the front, transmission mechanism 314 moves return connector 214r longitudinally toward the back—i.e., in the opposite direction. Put differently, the transmission mechanism ensures that force applied to the front-side connector will automatically transfer the force in the opposite direction to the rear-side connector, so that manual connection of the front-side connector automatically enables blind mating of the rear-side connector at the same time. Thus, longitudinal motion of connectors 214s and 214r is normal or perpendicular to the lateral movement of slider 312.

In one embodiment, when one connector moves a certain distance the transmission mechanism moves the other connector the same distance, but in other embodiments the transmission mechanism need not move both connectors the same distance. In one embodiment the transmission mechanism can be scissor mechanism, but other embodiments can use other mechanisms. Thus, with the aid of the transmission mechanism, supply fitting 214s and return fitting 214r move longitudinally between a retracted position shown in FIG. 3B and an extended position shown in FIG. 3C. The supply and return fittings can move in both directions: from the retracted position to the extended position, and from the extended position to the retracted position.

Cooling devices 304a-304d are fluidly coupled to the supply and return connectors by flexible fluid lines 316 and 318. Fluid line 316 couples the cooling devices to the supply connector 214s and fluid line 318 couples the cooling devices to return connector 214r. Use of flexible fluid lines 316 and 318 allows unimpeded extension and retraction of slider 312 and connectors 214s and 214r, so that the necessary fluid connections can be completed and cooling fluid can flow from supply manifold S, into cooling module 212 through supply connector 214s, through cooling devices 304a-304d, and finally out of cooling module 212 into return manifold R (see FIGS. 2A-2C). Between supply connector 214s and return connector 214r, cooling devices 304a-304d can form cooling loops in series, in parallel, or in a combination of series and parallel. The lines shown in FIGS. 3B-3C connecting cooling devices 304a-304d are there to illustrate the concept of fluid connections among the units, but the lines as shown in the drawings do not necessarily represent actual fluid lines between the cooling devices.

Figure 4A:
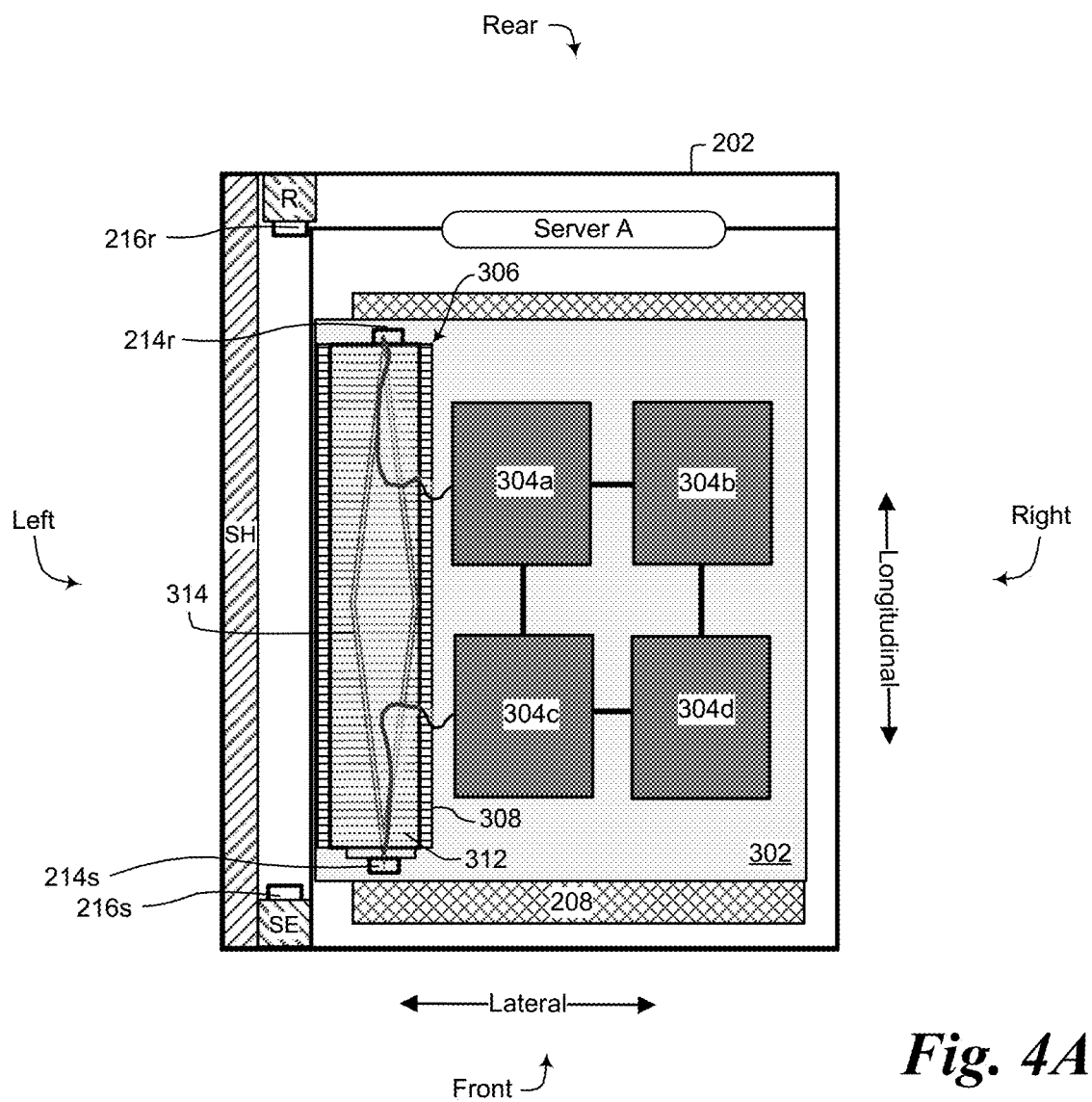
FIGS. 4A-4C are top views of the insertion of the embodiment of a server board including the cooling module of FIGS. 3A-3C into a rack such as the one shown in FIGS. 2A-2C.
Figure 4B:
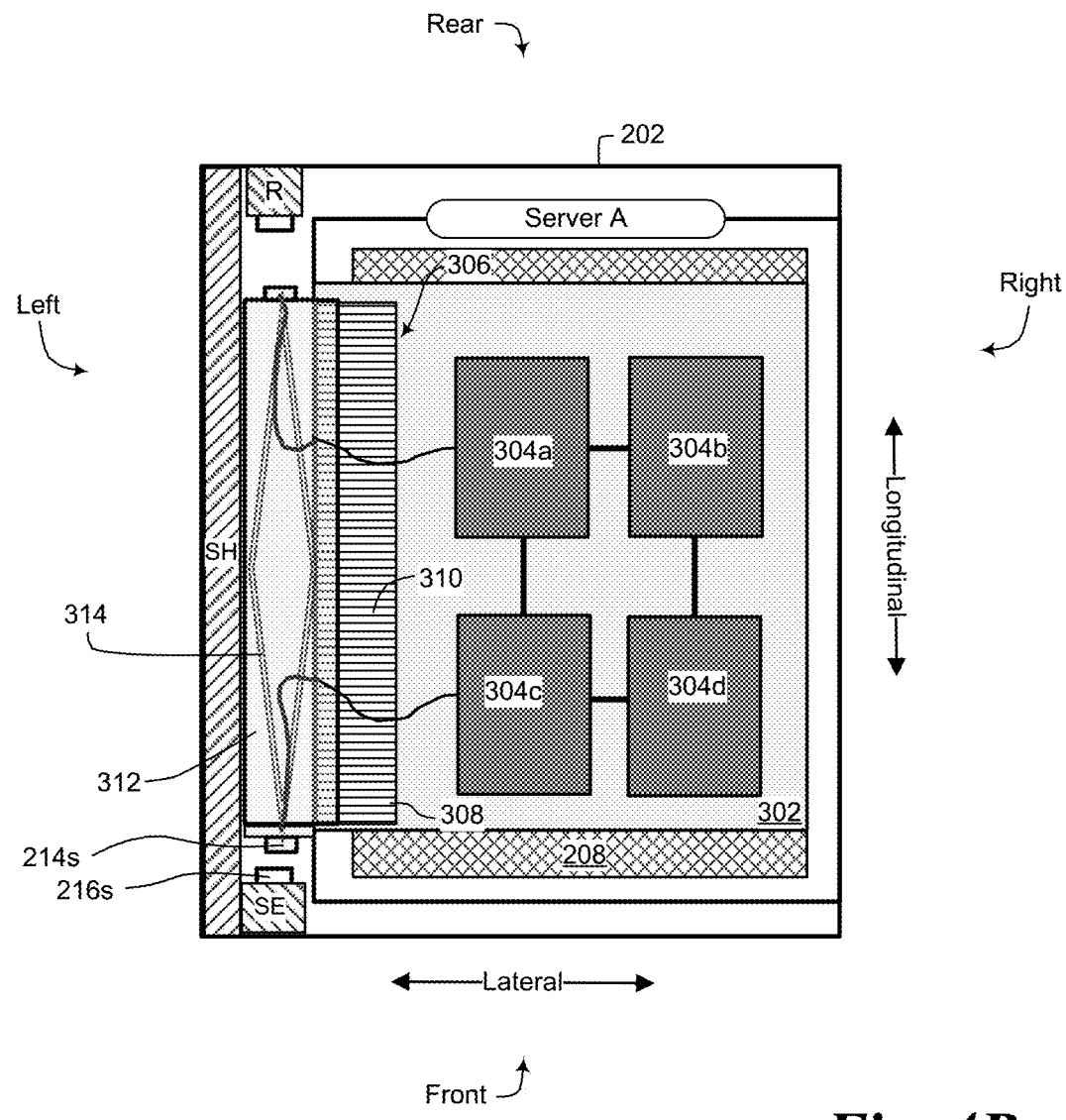
Figure 4C:
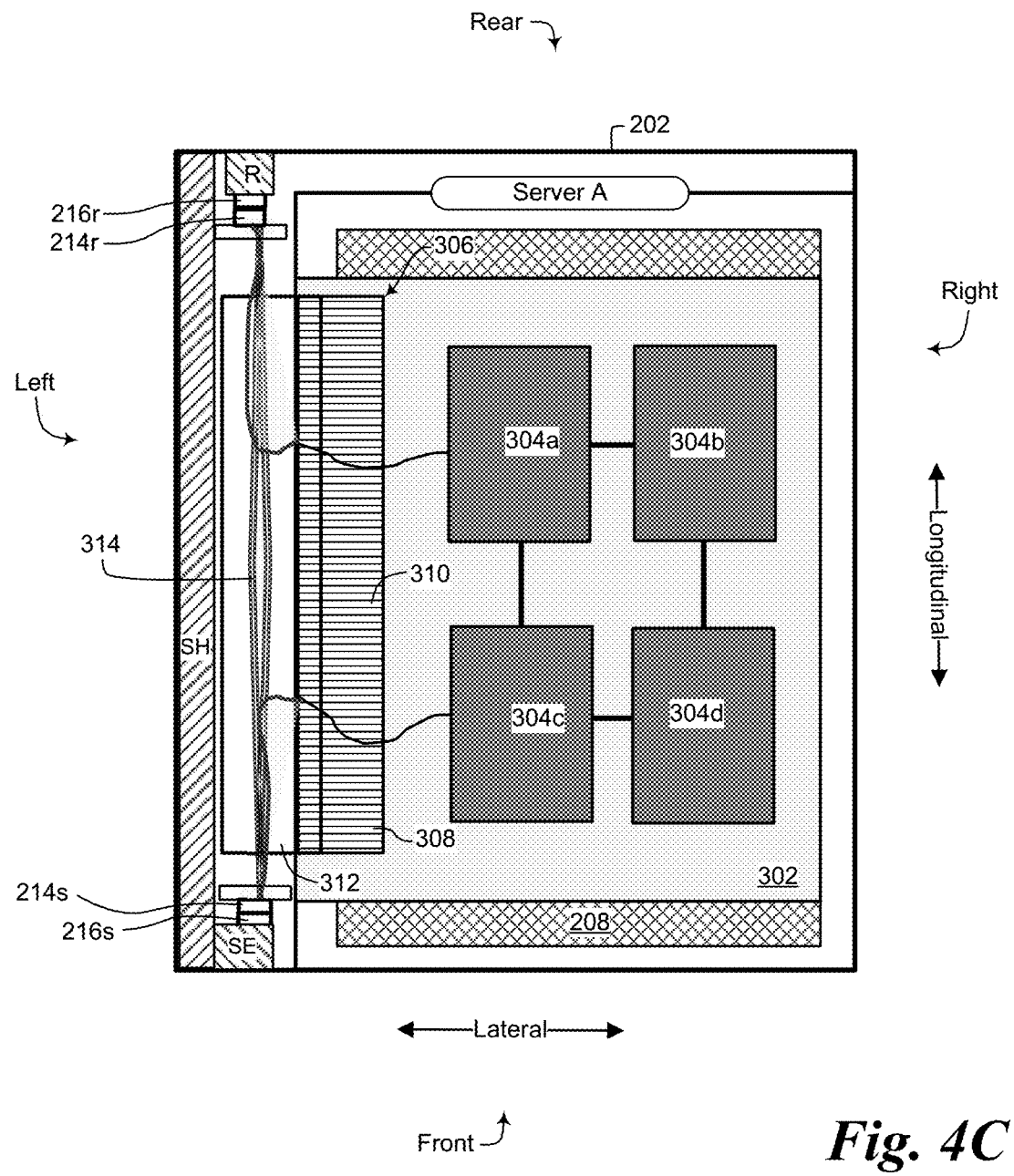

FIGS. 4A-4C illustrate an embodiment of the installation in a rack of a server having a cooling module 212. FIG. 4A shows the server at its initial insertion into rack 202. In the illustrated embodiment the server is inserted into rack 202 longitudinally, from the front of the rack to the rear. In this embodiment the supply manifold S and return manifold R are positioned along the left side of the rack, so the server is inserted into the rack with the slide mechanism 306 on the left. In an embodiment with the supply and return manifolds on the right side of the rack, the server would be inserted into the rack with the slide mechanism on the right.

FIG. 4B shows the next fluid connection step. Once the server is inserted into the rack, slider 312 is moved laterally to the left so that slider 312 extends outside the server chassis. With slider 312 in this position, the supply and return fittings 214s and 214r on the cooling module substantially align with their corresponding supply and return fittings 216s and 216r on the supply and return manifolds, respectively. Motion of slider 312 can be accomplished by hand, for instance by a technician installing the server in the rack. In the illustrated embodiment the supply manifold S has a lateral extension SE (see, e.g., FIG. 2C), so that supply and return fittings 216s and 216r are directly facing each other or, put differently, are collinear and located on the same longitudinal axis. In other embodiments supply and return fittings 216s and 216r need not be collinear (see, e.g., FIG. 2B), in which case the positioning of supply and return fittings 214s and 214r on the cooling module can be adjusted accordingly.

FIG. 4C shows the final fluid connection step. With slider 312 in the correct position, as shown in FIG. 4B, supply fitting 214s is pulled in the longitudinal direction toward the front of rack 202 until the supply fitting 214s engages with corresponding supply fitting 216s on the supply manifold. Forward movement of supply fitting can be accomplished by hand, for instance by a technician installing the server in the rack. As supply fitting 214s is pulled forward, transmission mechanism 314 drives return fitting 214r backward until it engages with corresponding return fitting 216r on the return manifold, at which point the fluid connection can be considered complete and cooling fluid can start flowing through the system.

Other embodiments are possible besides the ones described above. For instance:
    The servers and the server cooling modules can be different for different use cases.
    The fluid connections can be different.
    The rack can be designed in different configurations and the fluid distribution set can be different for different applications.

The above description of embodiments is not intended to be exhaustive or to limit the invention to the described forms. Specific embodiments of, and examples for, the invention are described herein for illustrative purposes, but various modifications are possible.

What is claimed is:

1. A server cooling module comprising:
    a board having one or more liquid cooling devices mounted thereon, the board having a first dimension and a second dimension;
    a slider assembly mounted on or near an edge of the board, the slider assembly including a slider movable both ways along the first dimension; and
    a fluid connection mechanism positioned in the slider, the fluid connection mechanism including:
        a first fluid connector movable both ways along the second dimension,
        a second fluid connector spaced apart from the first fluid connector along the second dimension and movable both ways along the second dimension, the second fluid connector being coupled to the first fluid connector by a transmission mechanism, wherein when the first fluid connector moves one way along the second dimension, the transmission mechanism causes the second fluid connector to move the opposite way along the second dimension, and a first flexible fluid line to fluidly couple the first fluid connector to the one or more liquid cooling devices and a second flexible fluid line to fluidly couple the second fluid connector to the one or more liquid cooling devices.

2. The server cooling module of claim 1 wherein at least one of the first fluid connector and the second fluid connector is a blind mating connector.

3. The server cooling module of claim 1 wherein the transmission mechanism is a scissor mechanism mechanically coupled to the first fluid connector and the second fluid connector.

4. The server cooling module of claim 1 wherein the first dimension is substantially perpendicular to the second dimension.

5. The server cooling module of claim 1 wherein the first dimension is a lateral dimension of the board and the second dimension is a longitudinal dimension of the board.

6. The server cooling module of claim 1 wherein the first fluid connector and the second fluid connector are collinear and face opposite directions.

7. The server cooling module of claim 1 wherein the slider assembly further includes a fixed part attached to the board, the fixed part including a plurality of guide channels that engage the slider and guide the motion of the slider relative to the fixed part.

8. A server cooling system comprising:
- a circuit board having one or more heat-generating components mounted thereon;
- a server cooling module coupled to the circuit board, the server cooling module including:
  - a board having one or more liquid cooling devices mounted thereon, the board having a first dimension and a second dimension, and each of the one or more liquid cooling devices being thermally coupled to a corresponding one of the heat-generating components on the circuit board;
  - a slider assembly mounted on or near an edge of the board, the slider assembly including a slider movable both ways along the first dimension; and
  - a fluid connection mechanism positioned in the slider, the fluid connection mechanism including:
    - a first fluid connector movable both ways along the second dimension,
    - a second fluid connector spaced apart from the first fluid connector along the second dimension and movable both ways along the second dimension, the second fluid connector being coupled to the first fluid connector by a transmission mechanism, wherein when the first fluid connector moves one way along the second dimension, the transmission mechanism causes the second fluid connector to move the opposite way along the second dimension, and
    - a first flexible fluid line to fluidly couple the first fluid connector to the one or more liquid cooling devices and a second flexible fluid line to fluidly couple the second fluid connector to the one or more liquid cooling devices.

9. The server cooling system of claim 8 wherein the first fluid connector is adapted to be fluidly coupled to a supply outlet and the second fluid connector is adapted to be fluidly coupled to a return inlet.

10. The server cooling system of claim 8 wherein the first fluid connector and the second fluid connector are collinear and face opposite directions.

11. The server cooling system of claim 8 wherein the slider assembly further includes a fixed part attached to the board, the fixed part including a plurality of guide channels that engage the slider and guide the motion of the slider relative to the fixed part.

12. The server cooling system of claim 8 wherein the one or more cooling devices includes a plurality of cooling devices, the plurality of cooling devices are fluidly coupled to each other in series, in parallel, or in a combination of series and parallel.

13. An information technology (IT) rack comprising:
- an IT rack frame having a top, a bottom, a front, a rear, and a pair of lateral sides;
- a fluid supply manifold positioned in the IT rack, the fluid supply manifold having a rack inlet and a plurality of supply outlets, the plurality of supply outlets being positioned at or near the front of the IT rack, and each of the supply outlets including a supply fluid connector; and
- a fluid return manifold positioned in the IT rack, the fluid return manifold having a rack outlet and a plurality of return inlets, the plurality of return inlets being positioned at or near the rear of the IT rack, and each of the return inlets including a return fluid connector,
- wherein the rack inlet and the rack outlet are positioned at the top of the IT rack or on the rear of the IT rack; and
- wherein the IT rack is adapted to house a plurality of servers, each of the servers comprising:
  - a circuit board having one or more heat-generating components mounted thereon, the circuit board having edges, the edges including a front edge, a rear edge, and a pair of lateral edges,
  - a server cooling module coupled to the circuit board, the server cooling module including:
    - a board having one or more liquid cooling devices mounted thereon, the board having a first dimension and a second dimension, and each liquid cooling device being thermally coupled to a corresponding heat-generating component on the circuit board;
    - a slider assembly mounted on or near one of the edges of the board, the slider assembly including a slider movable both ways along the first dimension, and
  - a fluid connection mechanism positioned in the slider, the fluid connection mechanism including:
    - a first fluid connector movable both ways along the second dimension and adapted to be fluidly coupled to a respective one of the supply fluid connector,
    - a second fluid connector spaced apart from the first fluid connector along the second dimension and adapted to be fluidly coupled to a respective one of the return fluid connector, wherein the second fluid connector is movable both ways along the second dimension, and wherein the second fluid connector is coupled to the first fluid connector by a transmission mechanism so that when the first fluid connector moves one way along the second dimension, the transmission mechanism causes the second fluid connector to move the opposite way along the second dimension, and a first flexible fluid line to fluidly couple the first fluid connector to the one or more liquid cooling devices and a second flexible fluid line to fluidly couple the second fluid connector to the one or more liquid cooling devices.

14. The IT rack of claim 13 wherein the fluid supply manifold and the fluid return manifold are positioned at or near a same lateral side of the IT rack.

15. The IT rack of claim 13 wherein the rack inlet is positioned at a top rear of the rack and the fluid supply manifold includes:
- a horizontal part fluidly coupled to the rack inlet, positioned at the top of the IT rack, and running from the rear of the IT rack to the front of the IT rack; and
- a vertical part fluidly coupled to the horizontal part, positioned at the front of the rack, and running from the top of the IT rack to the bottom of the IT rack, wherein the plurality of supply outlets are on the vertical part.

16. The IT rack of claim 15 wherein the fluid return manifold is positioned at the rear of the IT rack, runs vertically from the top of the IT rack to the bottom of the IT rack, and wherein each return fluid connector faces toward the respective one of the supply fluid connector.

17. The IT rack of claim 16 wherein the vertical part of the fluid supply manifold includes a lateral extension, wherein the lateral extension positions each supply fluid connector so that it is facing, and aligned with, the respective one of the return fluid connector.

18. The IT rack of claim 13 wherein the first fluid connector and the second fluid connector are collinear and face opposite directions.

19. The IT rack of claim 13 wherein the slider assembly further includes a fixed part attached to the board, the fixed part including a plurality of guide channels that engage the slider and guide the motion of the slider relative to the fixed part.

* * * * *